United States Patent [19]
Herzberg

[11] Patent Number: 5,659,579
[45] Date of Patent: Aug. 19, 1997

[54] MULTILEVEL CODING FOR FRACTIONAL BITS

[75] Inventor: Hanan Herzberg, Morganville, N.J.

[73] Assignee: Lucent Technologies Inc., Murray Hill, N.J.

[21] Appl. No.: 384,514

[22] Filed: Feb. 1, 1995

[51] Int. Cl.$^6$ ............... H04L 5/12; H04L 23/02
[52] U.S. Cl. ............ 375/262; 375/264; 375/265; 375/286; 371/37.7; 371/43.1; 371/56
[58] Field of Search ............ 375/261, 262, 375/264, 265, 286, 222, 223; 341/51, 56, 106; 371/37.1, 37.4, 37.7, 43, 55, 56

[56] References Cited

U.S. PATENT DOCUMENTS

| | | | |
|---|---|---|---|
| 5,185,763 | 2/1993 | Krishnan | 371/43 |
| 5,248,641 | 9/1993 | Long | 371/43 |
| 5,305,352 | 4/1994 | Calderbank et al. | 375/261 |
| 5,486,825 | 1/1996 | Cole | 371/43 |

*Primary Examiner*—Stephen Chin
*Assistant Examiner*—Don Vo
*Attorney, Agent, or Firm*—Ronald D. Slusky

[57] ABSTRACT

Method and apparatus for efficient encoding of symbols with multilevel encoding, where components of the symbols that are more susceptible to errors are encoded more robustly than components that are less susceptible to error. A non-binary constellation of symbols is handled with a fractional bit rate converter that combines with the multilevel encoder to create an effective and efficient constellation of symbols. Illustratively, digital data is encoded and mapped onto a set of symbols, with the two least significant bits of the symbols being encoded with a multi-level code. The least significant bit is encoded with a code that is more robust than the code of the next-to-least significant bit, in recognition of the fact that errors in the least significant bit are much more likely. The most significant bits are mapped with the aid of a fractional bit rate mapper that optimizes a selected aspect of the symbol constellation, such as average power.

22 Claims, 8 Drawing Sheets

MULTILEVEL CODING FOR FRACTIONAL BITS

CROSS REFERENCE TO A RELATED APPLICATION

This application is related to an application title "A Communication Arrangement With Improved Echo and Noise Suppression in a Channel Containing Quantization", application Ser. No. 08/384,498, filed Feb. 1, 1995.

BACKGROUND OF THE INVENTION

1. Field of the Invention

This invention relates to coding.

2. Description of Prior Art

Modems communicate digital data over an analog communication medium by mapping the data onto analog signals. Some of today's sophisticated modems communicate digital information by mapping the data onto analog signals and, thereafter, modulating an analog carrier with those signals. Typically, a collection of bits are combined to form a two-dimensional symbol, the symbol components are converted to analog form, and the analog-form components respectively modulate a carrier and a quadrature replica of the carrier. The two modulation products are added and filtered, and the result is applied to the transmission medium. A remote modem receives the signal, samples it, identifies the magnitudes and phases of the analog samples, converts the samples to symbols, and finally recovers the original bits of data. What these modems do, in effect, is encode the digital signals onto a two dimensional symbol constellation that is modulated onto a carrier.

When the telecommunication network is completely analog the primary sources of error are signal echoes from imperfect hybrids and other discontinuities in the transmission lines, as well as noise from a myriad of unknown sources. When the telecommunication network includes digital links, where the analog data is samples and quantized, an additional noise source is introduced that is rooted in the sampling and quantization that occurs at the network.

One might believe that the additional noise caused by the quantization in the network would lower the maximum data rate that may be achieved, but a copending application, Ser. No. 07/963,539, filed Oct. 20, 1992, now U.S. Pat. No. 5,394,437, achieves actually higher data rates than those that can be achieved by conventional modems. The higher rate is realized by synchronizing the sampling in the new modem to the sampling which takes place in the µ-law codec that is in the network, and by arranging for the signal levels of the modem to coincide with the quantization levels of the µ-law codec. Basically, the modem of the 07/963,539 application insures that no error signal is created by the sampling process in the network.

While the improved modem of the '539 application solves the quantization problem created by the digital network's codec, a difficulty still arises from echoes and noise that are unavoidably introduced into the signal just prior to the network's quantization. This problem is overcome with a modem that encodes the symbols sent to the central office so that the correct symbols are decoded in spite of errors caused by the interaction of noise with echos. The challenge, however, is to encode the signal in an efficient manner.

SUMMARY

Efficient encoding of symbols is realized with multilevel encoding, where components of the symbols that are more susceptible to errors are encoded more robustly than components that are less susceptible to error. A non-binary constellation of symbols is handled with a fractional bit rate converter that combines with the multilevel encoder to create an effective and efficient constellation of symbols.

In a disclosed illustrative embodiment, digital data applied to a modem is encoded and mapped onto a subset of the levels recognized by a central office codec, with the two least significant bits in the binary representation of the levels delivered by the modem having been encoded with a multilevel code. The least significant bit is encoded with a code that is more robust than the code of the next-to-least significant bit, in recognition of the fact that errors in the least significant bit are much more likely. The most significant bits are mapped with the aid of a fractional bit rate mapper that optimizes a selected aspect of the symbol constellation, such as average power. The corresponding echo canceller in the network first estimates the echo and subtracts it from the signal applied to the digital network by the central office. Thereafter, it decodes the received signal in stages. In the first stage, the least significant bit of symbols is identified based on a first error correcting code. In the second stage the remaining bits of the symbols are determined, with the aid of a second error correcting code and the results of the first stage. Block or convolutional encoding can be used.

DETAILED DESCRIPTION

Figure 1:
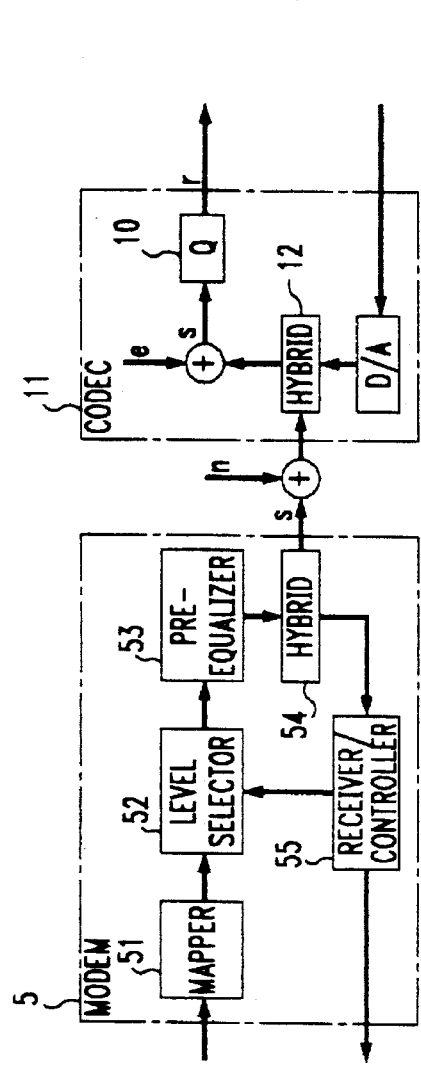
FIG. 1 shows the prior art arrangement.

FIG. 1 depicts an arrangement where a modem 5 of the type disclosed in the aforementioned '539 application (which is incorporated by reference herein) is connected to a central office codec 11. Local equipment which is coupled to modem 5 generates digital data, that data is mapped into symbols in mapper 51, the symbols are converted to levels of quantizer 10 in synchronism with the central office's µ-law codec 11 in level selector 52, and equalized in pre-equalizer 53. The output of equalizer 53 is applied to a two-wire facility by means of hybrid 54 which sends the signal to the central office. The matching of level selector 52 to quantizer 10 (both in level and in sampling times) is achieved via feedback from the central office derived through hybrid 54 and receiver/controller 55. Of course, it is possible to adjust the levels a priori in the factory, or dynamically. The dynamic adjustment may be continuous or take place only at the beginning of transmission. The sampling time is adjusted continually. The central office receives the signals through hybrid 12 and forwards them to quantizer 10, where the received levels are quantized and converted to digital form to form digital stream, r. Though not shown in FIG. 1, it is expected that the digital stream developed by quantizer 10 is sent to a remote central office and, therefrom, to a digital subscriber device (perhaps without even going through a conversion to analog levels via a complementary modem).

Experience tells us that the signal applied to quantizer 10 within the central office is adulterated by an additive noise, n, and an additive echo signal, e, which originates primarily from the behavior of hybrid 12 (though for sake of simplicity, FIG. 1 shows the echo being added by means of an adder). Thus, the input to quantizer 10 within the central office is s+e+n, and the output of the central office's codec is r, which is the quantized level of s+e+n. Even though the signal s is adjusted by modem 5 to coincide with the output levels of quantizer 10, the output r may be different from s because of the additive signals.

Figure 2:
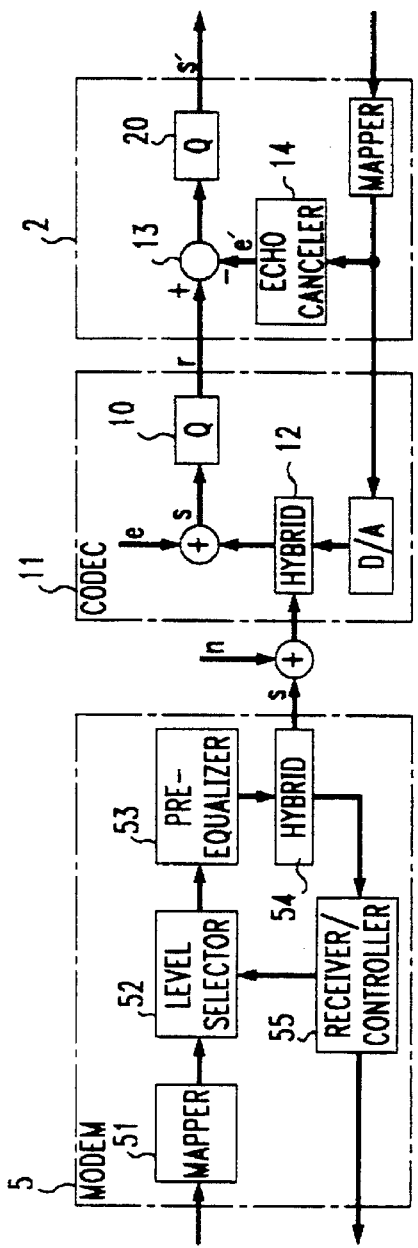
FIG. 2 presents a possible approach for solving the echo problem which does not fully overcome echo-induced errors.

The level of the noise is unknown, but the echo can be reasonably estimated. It makes sense, therefore, for the central office to subtract the echo estimate from the signal before it is transmitted. Alas, the central office equipment is already in place, and it is not practical to modify it. An alternative that must be fashioned, therefore, is to attempt to remove the echo component from the digital signal that flows in the network which follows the central office. Such equipment is shown in FIG. 2 in the form of block 2, where subtractor 13 subtracts the echo estimate, e', from the value of r, and the result is applied to quantizer, 20, which develops the digital signal, s'. The echo estimate is derived in accordance with well known techniques by means of echo canceller 14 which is responsive to the signal that is coupled to hybrid 12 through a D/A converter. For echo canceling, see Gitlin et at, "Data Communications Principles", Plenum Press, 1992.

Figure 5:
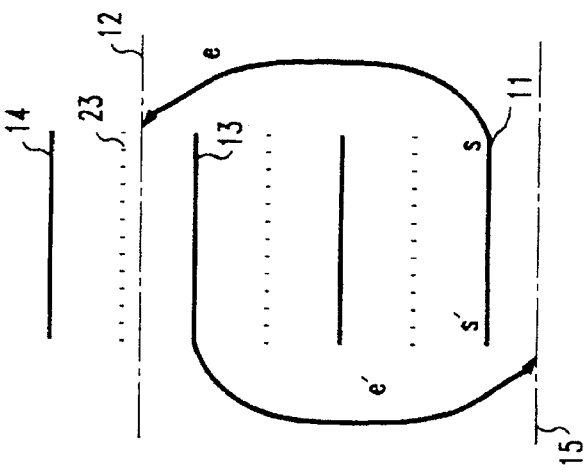
FIGS. 3–5 illustrate the possible echo-induced errors that are possible with the arrangement of FIG. 2.
Figure 4:
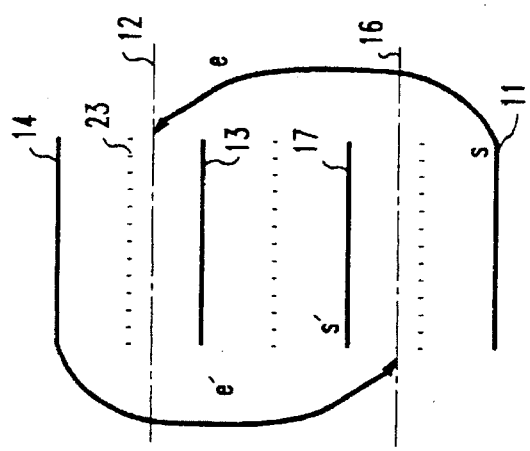
Figure 3:
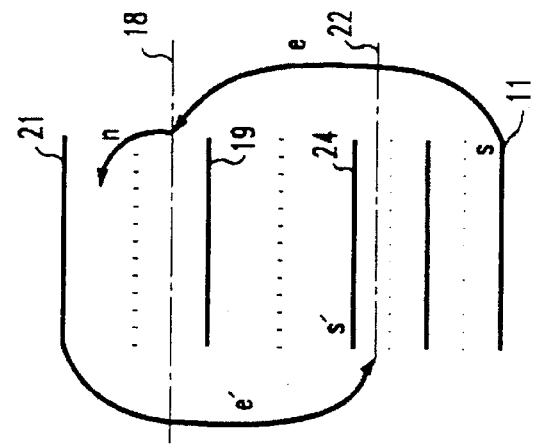

One might expect that the signal s' would be essentially equal to signal s. That is, the only remaining error should be the additive noise signal, n, and a signal that corresponds to the difference between the echo, e, and its estimate, e'. Unfortunately, the FIG. 2 arrangement fails to remove all effects of the echo. FIGS. 3–5 demonstrate the problem.

In FIG. 3, the signal s is sent at level 11, the echo brings the signal up to level 12, which is close to threshold 23 between levels 13 and 14. When the noise happens to have a small negative value, quantizer 10 within the central office chooses level 13, the signal e' is subtracted to yield level 15, and quantizer 20 develops signal s', which is at level 11 of signal s. In other words, no error is introduced. In FIG. 4, on the other hand, the small noise level happens to be positive and it moves the signal at the input of quantizer 10 to above threshold 23. The result is that quantizer 10 outputs level 14, the echo estimate is subtracted to reach level 16; but now quantizer 20 yields level 17 rather than level 11. That, of course, is a one-level error.

In FIG. 5 the levels are not uniform (which indeed is the case in the μ-law codec), and that leads to the possibility of a two-level error. Starting at level 11, the echo signal moves the input signal of quantizer 10 to level 18. The noise pushes the signal to above the threshold between level 19 and 21, so quantizer 10 develops level 21. Subtracting the estimate signal e' yields level 22, and quantizer 20 develops the signal of level 24. That is two levels above level 11. It can be shown that the probability of an error of the type shown in FIG. 4 is substantially greater than an error of the type shown in FIG. 5.

As indicated above, the quantized levels of signal s correspond to a set of symbols that are created by selector 52. In terms that are familiar to artisans who deal with modems, the symbols of s and r can be viewed as a constellation of symbols along the x axis. The most prevalent error is an error that shifts a symbol to one of its neighbors in the constellation. The next most likely error is one that skips over a symbol in the constellation. If the set of quantized levels, s, is denoted in order (i.e., the first symbol is 00000, the next is 00001, the following one is 00010, etc.), then the most prevalent error is an error in the least significant bit of the symbol. The next most prevalent is in the next to the least significant bit of the symbol. It follows that whatever error correcting codes are incorporated into signal s, at least these two types of errors should be correctable.

Aside from the fact that the echo and noise can combine to cause errors even when the echo is removed and that the μ-law codec action of quantizer 10 can compound the problem, it is recognized that the lower levels of the μ-law codec are too close together to give a good performance level, and that the very high levels of the μ-law codec work fine but "cost" too much power. It appears advantageous, therefore, to not use all 255 levels of the network's μ-law codec, which means that the bit rate that can be sent through the network's codec is less than 8 bits per symbol. On the other hand, the number of useful levels may be greater than 128 (corresponding to 7 bits per symbol), which means that a fractional number of bits per symbol can be employed. The number of useful levels in a μ-Law codec is dependent on the level of noise immunity that is desired. As is well known in the art, fractional bit rate transmission results when a number of symbols L is developed from a number of input bits B, and the ratio of B/L is a mixed fraction. In the context of this disclosure, the mapping of bits into symbols also insures (through careful design of the mapping, as disclosed below) that those symbols which correspond to codec levels which we do not wish to use do not appear at the output of the mapper.

Generalizing, in many applications the number of constellation symbols that are desired to be used in not a power of two, which is tantamount to having a number of bits per symbols being a mixed fraction, e.g., 7¼. U.S. Pat. No. 5,103,227 issued to Betts on Apr. 7, 1994 discloses an approach for creating such symbols, which is based on the concept of modulus conversion. The notion is to convert an incoming string of bits B to a sequence of L symbols. For example, when there are 5 symbols in the constellation (or the "alphabet"), and B is 111110001 (497), the value of B can be expressed in base 5 as $3442_5$ which corresponds to $3\times5^3+4\times5^2+4\times5^1+2\times5^0$. The base, or modulus, q, corresponds, of course, to the output alphabet of the mapper.

In the above example all of the incoming bits (of B) are mapped; but that is not absolutely necessary. While it is established that for a fractional bit rate, B/L, the number of symbols in the constellation must be at least $2^{B/L}$, rounded up to the next integer, it is also true that only a slightly heavier burden is placed on the constellation when less than all of the bits are mapped. This may be quickly appreciated from the following example. When the constellation contains less than 256 symbols and more than 128 symbols, a fractional bit rate between 7 and 8 can be supported. If one were to take sets of 29 bits, for example, and map them onto 4 symbols, a rate of 7.25 bits per symbol would result. According to the above, a rate of 7.25 bits per symbols requires a constellation of $2^{7.25}$ symbols (rounded up to the next integer), which is 153. On the other hand, if one of those 7.25 bits is not mapped, and only the remaining 6.25 bits are mapped, then the constellation for the 6.25 mapped bits plus one unmapped bit needs to contain 154 symbols. This is a de minimus increase. Interestingly, as demonstrated by Table I below the size of the constellation grows only moderately as the number of mapped bits is decreased. Concurrently, the number of bits that are applied to the mapper (B) is decreased and, correspondingly, so does the complexity of the mapper.

TABLE I

| Number of mapped bits | Number of unmapped bits | B | Size of Constellation |
| --- | --- | --- | --- |
| 7.25 | 0 | 29 | 153 |
| 6.25 | 1 | 25 | 154 |
| 5.25 | 2 | 21 | 156 |
| 4.25 | 3 | 17 | 160 |
| 3.25 | 4 | 13 | 160 |
| 2.25 | 5 | 9 | 160 |
| 1.25 | 6 | 5 | 192 |

When the number of bits that are needed to be mapped is small, the conventional means for implementing the mapping is through a look-up table memory; i.e. a ROM. The content of the memory used for performing the actual mapping can be prepared by using the modulus conversion approach mentioned above. On the other hand, there is really no particular advantage to using this method since the mapping installed in the ROM is computed only once. More importantly and advantageously, since $2^B \leq q^L$ (i.e., not all of the combinations in base q are in use), the data in the mapping memory can be arranged to improve a selected criterion, such as arranging for different probabilities of the symbols in order to reduce overall average power. This is demonstrated below.

When some bits are mapped and others are not mapped, and when the bits that are mapped (into a constellation of q symbols) are the most significant bits, then the overall signal constellation (of $q \times 2^u$ symbols, u being the number of unmapped bits) can be viewed as being divided into q subsets, denoted by $S_1, S_2, \ldots, S_q$. If the probability of a symbol from the subset $S_i$ is $pr_i$ and $P_i$ is the average power of the symbols in this subset then, the overall average power is given by $$P_a = \sum_{i=1}^{i=0} pr_i P_i$$

In order to minimize the average power, $pr_i$ should be big for small $P_i$'s. It may be noted that in the case of a μ-law modem, the advantage of "smart" mapping is bigger than that obtained in the case of equally spaced signal constellation, because of the large power of the subsets with high level signals. It may also be noted that if one wishes to obtaining a zero DC level, a symmetry (in respect to the zero level) is required. In such a case, the analog levels of the symbols in subset $S_1$ should be the negative version of the analog levels of the symbols in subset $S_q$ ($P_1 = P_q$), and their probabilites should be equal ($pr_1 = pr_q$). In general, therefore, one can divide the subsets into two symetric groups, use a positive index with one group and a negative index for the other group. For the positive index group, the index can be arranged so that $P_{i+1} > P_i$.

By way of example, the following describes an arrangement where the mapping of 7.25 bits per symbol is performed by mapping 9 bits per 4 symbols. This corresponds to 2.25 bits per symbol, as described in the penultimate row in Table I. In such a case, we have 5 subsets ($q = \lceil 2^{2.25} \rceil = 5$) and each subset includes 32 symbols ($2^5$), leaving 5 bits per symbol unmapped. Two of these subsets ($S_2$ and $S_3$) have a negative replica and $S_1$ is unique (straddling the zero, with half of the symbols corresponding to a positive level and half of the symbols corresponding to a negative level).

The total number of combinations contained in the four symbol sequence is $q^4 = 625$. The sequence ($1^2, \mp 2, \mp 3$), for example, contains two symbols from subset $S_1$, one symbol is either from $S_2$ or from $S_{-2}$, and one symbol is either from $S_3$ or from $S_{-3}$. The number of sequences of this type is $$\binom{4}{2} \times 2^2 \times 2 = 48.$$

All the 625 combinations, available in this case, are present in Table II.

TABLE II

| The sequence | # of combination |
| --- | --- |
| $(1^4)$ | 1 |
| $(1^3, \mp 2)$ | 8 |
| $(1^2, \mp 2^2)$ | 24 |
| $(1, \mp 2^3)$ | 32 |
| $(\mp 2^4)$ | 16 |
| $(1^3, \mp 3)$ | 8 |
| $(1^2, \mp 2, \mp 3)$ | 48 |
| $(1, \mp 2^2, \mp 3)$ | 96 |
| $(\mp 2^3, \mp 3)$ | 64 |
| $(1^2, \mp 3^2)$ | 24 |
| $(\mp 2^2, \mp 3^2)$ | 96 |
| $(\mp 2, \mp 3^3)$ | 64 |

Since 9 bits are being mapped, only $2^9$, or 512, combinations need to be selected from the 625 available combinations. In order to minimize the average power we should minimize the probability of symbols from $S_3$ and $S_{-3}$, since they require the most power. A list of 512 sequences in which $pr_3$ is minimized is given in Table III. The probabilities obtained by this selection are $pr_1 = 0.2285$, $pr_2 = 0.4561$ and $pr_3 = 0.3154$ (recall that $pr_1$ is related to 32 symbols, whereas $pr_2$ and $pr_3$ are related to 64 symbols). For the case of the μ-law modem with a minimum distance of 4, the average power of the selection listed in Table III is $P_a = -13.15$ dbm (where a power of 1 unit is normalized to $-66$ dbm). It can be shown that if the symbols were selected to include symbols from the 5 sets with equal probability, the value of $P_a$ would be $-12.22$ dbm, which means that a gain of approximately 1 dbm can be obtained merely by a wise selection of the mapped symbols.

TABLE III

| The sequence | # of combinations |
| --- | --- |
| $(1^4)$ | 1 |
| $(1^3, \mp 2)$ | 8 |
| $(1^2, \mp 2^2)$ | 24 |
| $(1, \mp 2^3)$ | 32 |
| $(\mp 2^4)$ | 16 |
| $(1^3, \mp 3)$ | 8 |
| $(1^2, \mp 2, \mp 3)$ | 48 |
| $(1, \mp 2^2, \mp 3)$ | 96 |
| $(\mp 2^3, \mp 3)$ | 64 |
| $(1^2, \mp 3^2)$ | 24 |
| $(\mp 2^2, \mp 3^2)$ | 96 |

TABLE III-continued

| The sequence | # of combinations |
| --- | --- |
| $(\mp 2, \mp 3^3)$ | 64 |
| $(\mp 3^4)$ | 16 |
| $(1, \mp 2, \mp 3^2)$ | 96 |
| $(1, \mp 3^3)$ | 32 |

It may also be noted that in the case of the μ-law modem, the minimum distance between the symbols from $S_1$ is smaller than that of the symbols from $S_3$ and, therefore, different error protection may be advantageous for a symbol taken from different subsets. For instance, probably no error protection is required for symbols from $S_3$ and $S_{-3}$, small correction capability may be desired for symbols from $S_2$ and $S_{-2}$, and large correction capability is desired for symbols from $S_1$. The selection presented in Table IV ensures that at least one of the symbol in the sequence is either from $S_3$ or from $S_{-3}$ and that chioce increases the data through-put since no error correcting redundancy need to be included.

TABLE IV

| The sequence | # of combinations |
| --- | --- |
| $(1^3, 3)$ | 8 |
| $(1^2, \mp 2, \mp 3)$ | 48 |
| $(1, \mp 2^2, \mp 3)$ | 96 |
| $(\mp 2^3, \mp 3)$ | 64 |
| $(1^2, \mp 3^2)$ | 24 |
| $(\mp 2^2, \mp 3)$ | 96 |
| $(1, \mp 2, \mp 3^2)$ | 96 |
| $(1, \mp 3^3)$ | 32 |
| $(\mp 2, \mp 3^3)$ | 48 |

Similarly, we can select sequences such that at least two of the symbols are taken from one of the following subsets: $S_2$, $S_{-2}$, $S_3$ or $S_{-3}$. Namely, for half of the symbols only small correction capability is required, thereby, the achievable data rate can be increased further. Clearly, the cost is a larger average power. However, as long as the power restriction of the system is not violated, there is no harm in increasing the average power.

To summarize, in general, the mapping schema disclosed herein is based on the notion of selecting a particular mapping that advances a particular cirterion. If it is desired to minimize the average power (a kind of shaping code), the probability of subsets with low power symbols should be increased. In the case of a non-equally spaced constellation, increasing the data rate can be achieved by reducing the number of symbols for which error protection is required. Similar to error correction coding, where an increase in the coding gain can be achieved by increasing the redundancy, the effective redundancy in the mapping can be increased. Using the same size of signal constellation with reduced number of bits per symbol can be interpreted as increasing the redundancy. By increasing the redundancy the probability of subsets that comply with the desired criterion can also be increased.

Figure 6:
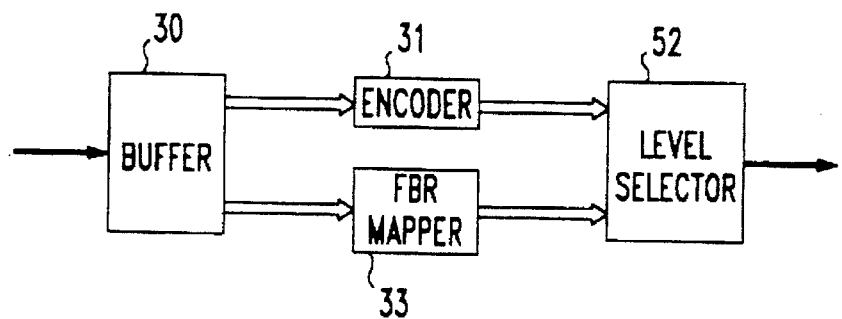
FIGS. 6–8 depict a number of encoding arrangements.
Figure 7:
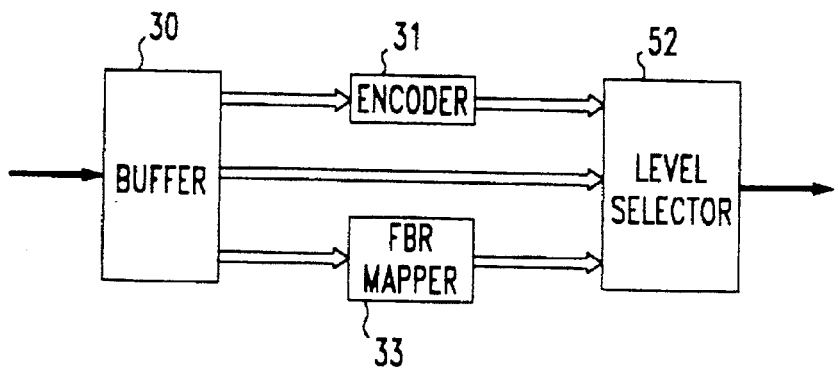
Figure 8:
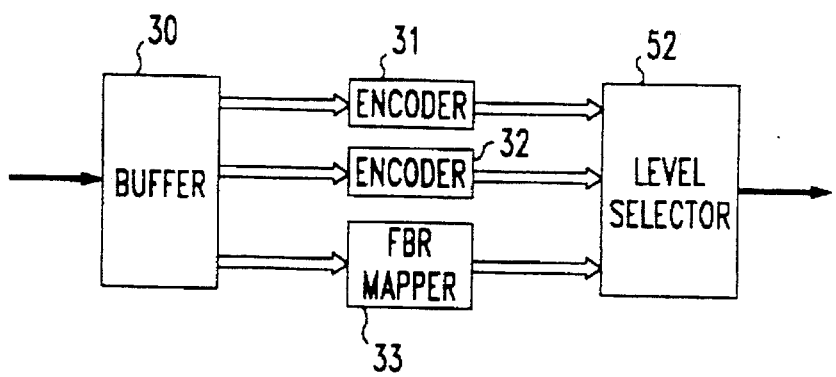

Combining the need to protect the two least significant bits of the symbols applied to codec 11 with the desire to use a fractional bit rate to maximize utilization of codec 11, we realized that fractional bit rate mapping of the type where not all of the bits are mapped can be combined to an advantage, as disclosed above, with coding of the bits that do not participate in the fractional bit rate mapping to achieve superior performance. FIG. 6 shows one example of such an arrangement where every one of the bits that is not mapped is applied to a coder, FIG. 7 shows an example where only some of the bits that do not participate in the fractional bit rate mapping are encoded (and the other ones are not), and FIG. 8 presents an example where the encoding is multilevel. The FIG. 8 arrangement is particularly well suited to the problem at hand, because the encoding that is desired for the least significant bit of the symbols going to quantizer 10 aims to more robustly protect the bit next to the least significant bit. Of course, a more robust encoding requires more redundancy and is more expensive in terms of transmission capacity.

Figure 9:
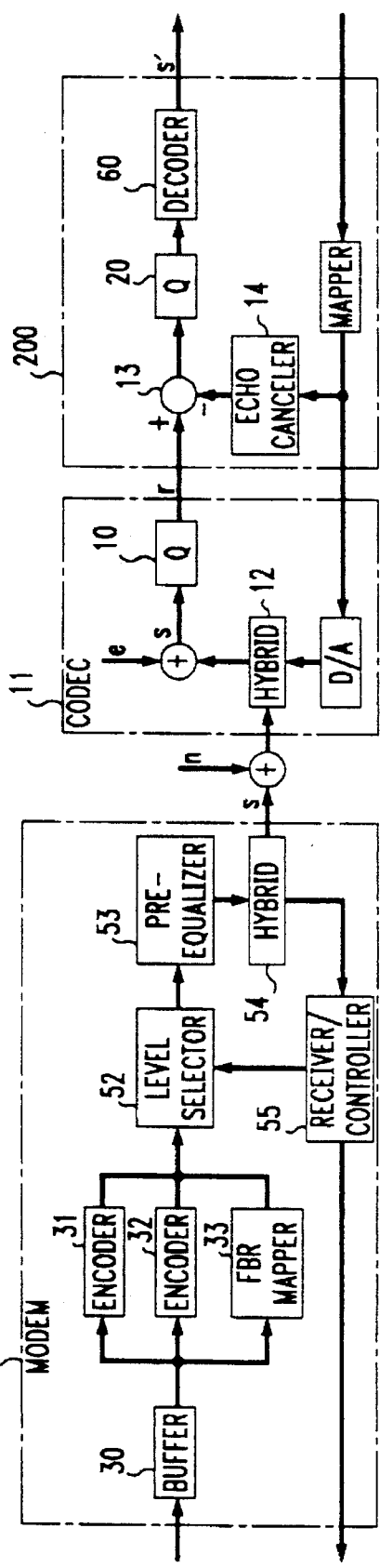
FIG. 9 illustrates an arrangement that eliminates echo-induced errors.

FIG. 9 presents an arrangement according to the principles disclosed herein where it may be noted that elements 30, 31, 32, and 33 replace mapper 51 of FIG. 1. Equalizer 53 can follow the principles taught in U.S. patent application filed for Ayangolu et at, entitled "High Speed Quantization-Level-Sampling Modem with Equalization Arrangement", dated Jan. 3, 1994, and beating the Ser. No. 08/176,742, now U.S. Pat. No. 5,528,625.

As indicated above, it is advantageous to not use the full 255 levels of quantizer 10 and, therefore, a rate that is lower than 8 bits per symbol is the result. We have concluded that a rate of 6.73333 is good for certain applications, and that rate corresponds to a transmission of 202 information bits with every 30 symbols. That is with every 202 information bits that flow through buffer 30, there are 30 symbols that are created by blocks 30–33. With every two symbol periods, buffer 30 delivers 11 bits to fractional bit rate mapper 33, in response to which mapper 33 delivers 6 bits with every symbol period. Effectively, mapper 33 creates a bit every two symbols. It may be noted that the output of this mapping is capable of supporting an alphabet of $2^{12}$, but since the input is restricted to $2^{11}$ combinations, there are some members of the alphabet that are never applied to level selector 52. The 6 bits of mapper 33 form the most significant bits of the symbols applied to the level selector. Getting back to buffer 30, with every 30 symbol periods, buffer 30 delivers 27 bits to encoder 32. Encoder 32, correspondingly, delivers a single bit to level selector 52 with every symbol period. Effectively, encoder 32 creates a bit every 10 symbol periods. The output of encoder 32 forms the next to least significant bit of the symbols applied to the level selector. Lastly, with every 30 symbol periods buffer 30 delivers 10 bits to encoder 31, and encoder 31 delivers a single bit to level selector 52 with every symbol period. Effectively, encoder 31 creates a 2 bits every 3 symbol periods. The output of encoder 31 forms the least significant bit of the symbols applied to the level selector. Specifically which bits of the 202 bits are employed by encoders 31, 32 or 33 is not important, so any convenient routing algorithm will do, as long as that algorithm is known, so that the received symbols can be decomposed eventually into the proper sequence of bits.

Figure 10:
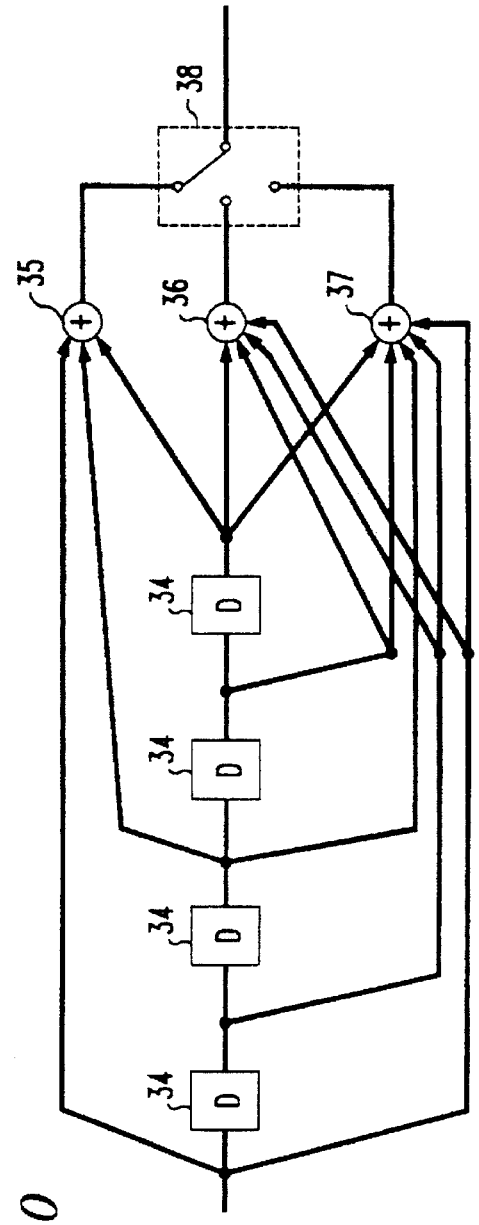
FIG. 10 illustrates one convolutional encoding arrangement for encoder 31 of FIG. 8.

The design approach specifics of elements 31, 32 and 33 are well known in the art, in the sense that artisans know how to create these elements given the particular input/output function that is desired. For example, mapper 33 may be a ROM with the 11 bit input being merely an address that is applied to the ROM. The ROM has 12 outputs which are divided into two groups of 6 bits each, and the groups are alternately directed to the output of mapper 33 with each symbol period. Mapper 32, for example, may be a simple parity code generator which for every 9 bits adds a parity bit. Mappers 31 and/or 32 may be block encoders or convolutional encoders. An illustrative convolutional encoder for mapper 31 is shown in FIG. 10. The coder of FIG. 10 includes 4 delay elements, modulo 2 adders 35, 36, and 37 and commutating switch 38. With every set of three symbols interval, a bit is inserted into the first delay element 34 of the FIG. 10 encoder (with data shifting through the succeeding delay elements). Switch 38 accesses a different adder with each symbol interval and commutates among the three adders.

Figure 11:
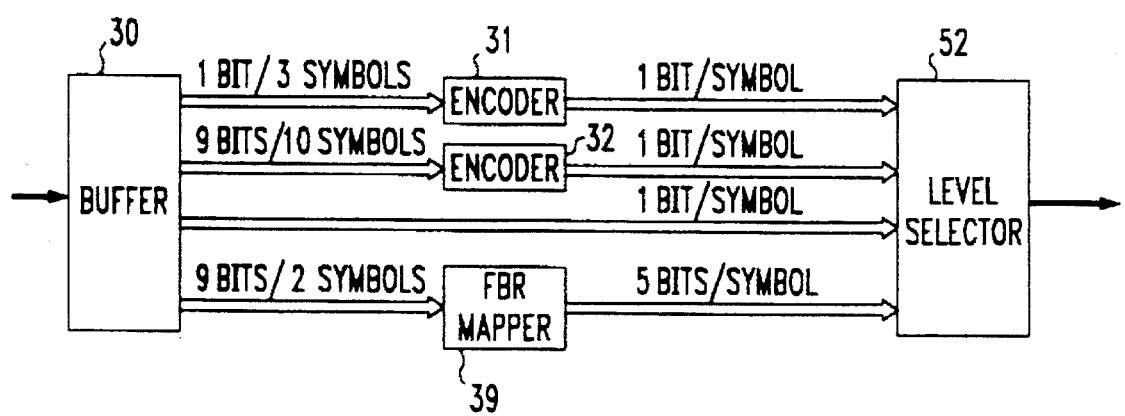
FIG. 11 depicts still another encoding arrangement.

It may be noted that different encoders may be used, and that a multi-level encoder arrangement that is modeled after FIG. 7 is also possible. Such an arrangement is depicted in FIG. 11, where the multi-level encoder is the same as in FIG. 8, and the only change is in the number of bits that are produced by Fractional Bit Rate (FBR) mapper 39. It may be noted that a ROM implementation of mapper 33 requires $12\times2^{11}$ bits, whereas a ROM implementation of mapper 39 requires $10\times2^9$ bits; a reduction by a factor of 4.8.

The fact that modem 5 of FIG. 9 includes a means for incorporating error protection for the two least significant bits of the symbols applied to level selector 52 and, thence, to quantizer 10 is not the end of the journey, of course. Means must be provided in element 200 to make use of the error correcting codes and to thereby correct the errors that might otherwise appear at the output. That task is assigned to decoder 60. The conventional approach for correcting such errors is through "soft decoding", where the actual level that is obtained after subtracting the echo estimate, e', is evaluated vis-à-vis the two possible quantized values that the signal might assume. Describing the process very generally, a "cost/benefit" metric is assigned to the two choices and the "metric" is accumulated over the entire sequence of the 30 symbols. The encoding action of elements 31, 32, and 33 results in a finite set of impermissible sequences in signal s; or sequences with a high associated cost. Based on the accumulated "metric" value, the right sequence can be identified and, hence, errors can be corrected.

Figure 12A:
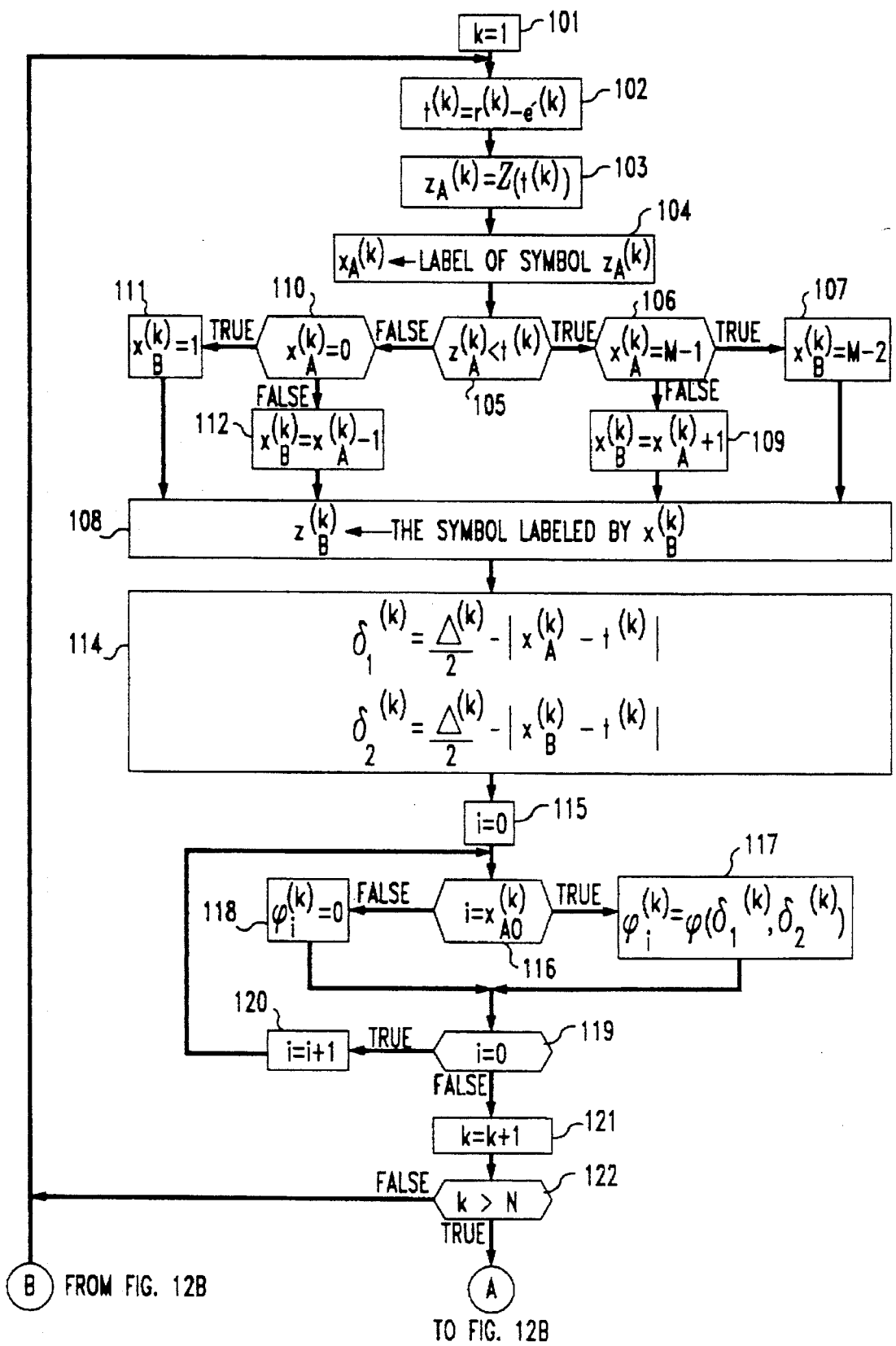
FIGS. 12A and 12B presents a flow chart of decoding a signal encoded by encoder 31.
Figure 12B:
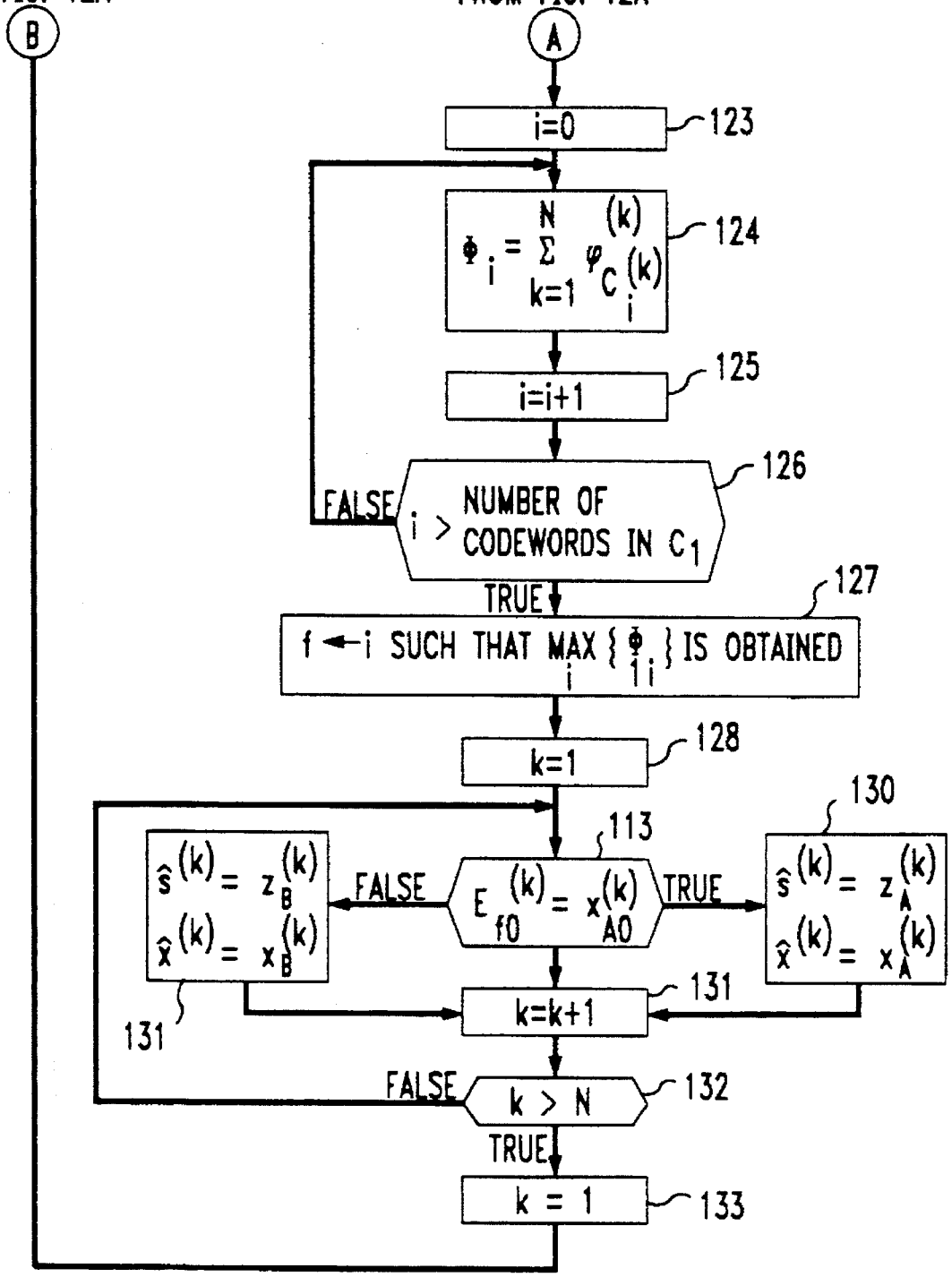

FIG. 12 presents a flow diagram of the decoding algorithm performed in block 200 of FIG. 9, as it relates to the least significant bit. It describes the decoding of a block code where the block length is N. For a convolutional code, a Viterbi decoder can be used (see the aforementioned Gitlin reference), with the same "cost/benefit" metric as described below. The flow chart of FIG. 12 incorporates the action of elements 13 and 20, as well as the decoding of block 60. In other words, the FIG. 12 flow chart corresponds to an embodiment of block 200 via a stored program controlled processor that carries out the processing of FIG. 12.

Starting at element 101 of the flowchart, an index k, which designates a member in a block of signals, is set to 1. Control passes to element 102, where signal t (the output of subtractor 13 in FIG. 9) is evaluated. Element 103 in FIG. 12 quantizes signal t in accordance with the reduced alphabet of the µ-law encoder to obtain an intermediate signal, $z_A^{(k)}$, which corresponds to the output of block 20 in FIG. 9. In element 104, the signal $z_A^{(k)}$ is recognized to be associated with a label of the signal $x^{(k)}$, which is the signal applied to block 60.

The quantization performed by the Z operator of element 103 chooses the nearest of the two neighbors on either side of $t^{(k)}$. The two neighbors are identified here by $z_A^{(k)}$, and $z_B^{(k)}$, where the neighbor that is closest to $t^{(k)}$ is chosen by the quantization process to be labeled $z_A^{(k)}$. Decision element 105 determines whether the quantization of signal $t^{(k)}$ chose a lower level neighbor or a higher level neighbor. When $z_A^{(k)}$ is higher than $t^{(k)}$, decision element 106 determines whether the corresponding label, $x_A^{(k)}$, is equal to M−1, where M is the number of labels in the block 60 modem (M−1 is the last label in the set of labels and corresponds to the biggest binary number). When that is true, element 107 sets the other neighbor, $x_B^{(k)}$, to M−2, and control passes to element 108. When that is false, element 109 sets $x_B^{(k)}$ to $x_A^{(k)}+1$ and, again, control passes to element 108. When $t^{(k)}$ is not greater than $z_A^{(k)}$ and when $x_A^{(k)}$ is equal to zero (i.e., the lowest label), element 111 $x_B^{(k)}$ to 1 and control passes to element 108. Lastly, when $x_A^{(k)}$ is not equal to zero, element 112 sets $x_B^{(k)}$ to $x_A^{(k)}-1$ and, as before, control passes to element 108.

Having evaluated the second neighbor, $x_B^{(k)}$, element 108 determines the $z_B^{(k)}$ level that corresponds to $x_B^{(k)}$. Element 114 evaluates distances from thresholds, which relate to the "cost/benefit" metric, and control passes to element 115.

The "metric" over the entire block associated with selecting $x_A^{(k)}$ or $x_B^{(k)}$ is evaluated in the loop that follows element 115. Element 115 sets index i to zero and element 116 compares the value of i to the least significant bit of $x_A^{(k)}$, $x_{A0}^{(k)}$. When they are equal, the metric is determined in block 117. When the variance of the noise, $\sigma^2$, is known, the "cost/benefit" metric is $\phi_i^{(k)}=\phi(\delta_1^{(k)},\delta_2^{(k)})$, where $$\phi(\delta_1,\delta_2) = \log \frac{Q(-\delta_1/\sigma)}{Q(-\delta_2/\sigma)}.$$

In the equation, $$\delta_1^{(k)} = \frac{\Delta^{(k)}}{2} - |z_A^{(k)} - t^{(k)}|, \delta_2^{(k)} = \frac{\Delta^{(k)}}{2} - |z_B^{(k)} - t^{(k)}|,$$

and $$Q(x) = \frac{1}{\sqrt{2\pi}} \int_x^\infty e^{-y^2/2} dy,$$

where $\Delta$ is the distance between the thresholds that surround $t^{(k)}$.

When the least significant bit of $x_A^{(k)}$ is not equal to i, then according to element 118, $\phi_i^{(k)}=0$. Once the metric is determined for i=0, with the help of decision element 119 and action element 110 which increments i, a "cost/benefit" metric is determined for i=1. Control then passes to element 121, with $\phi_1^{(k)}$ and $\phi_0^{(k)}$ determined and the index k incremented. As an aside, if the noise variance is not known, a sub-optimal decoding can take place, with the "cost/benefit" metric defined by $\phi(\delta_1^{(k)},\delta_2^{(k)})$ being equal to $\delta_2^2$ when $\delta_1^2 \geq 0$ and $\delta_2^2 0$; being equal to 0 when $\delta_1 \geq 0$ and $\delta_2 \geq 0$; and being equal to $\delta_2^2 - \delta_1^2$ when $\delta_1 < 0$ and $\delta_2 \leq 0$.

Returning to FIG. 12, element 121 increments index k and passes control to decision element 122. When k is not greater than the size of the block, N, element 122 passes control back to element 102. When k is greater than N, control passes to element 123 where index i is set to zero and the process of determining the best suited codeword commences. Element 124 evaluates the accumulated metrics for the $i^{th}$ codeword, $E_i$, element 125 increments index i, and element 126 determines whether a metric of a next codeword should be evaluated. When the index i is not greater than the number of codewords in E, control returns to element 124 (where E is the error correcting code used for the least significant bit). Otherwise, element 127 identifies the index i for which the maximum benefit is obtained, and the value of this index is memorialized by assigning it to index f. Control then passes to element 128, where index, k, is set to one.

Following the setting of index k in element 128, decision 113 compares the least significant bit of the $k^{th}$ element in the code corresponding to index f, $E_f^{(k)}$ to $x_{A0}^{(k)}$ and, if they are equal, then the final estimate of the sent label, $\hat{x}^{(k)}$, is set equal to $x_A^{(k)}$, and the final estimate of the sent symbol, $\hat{s}^{(k)}$, is set to $z_A^{(k)}$. This is accomplished in element 130. When decision element 113 obtains a false answer, then pursuant to element 131, the final estimate of the sent label, $\hat{x}^{(k)}$, is set equal to $x_B^{(k)}$, and the final estimate of the sent symbol, $\hat{s}^{(k)}$, is set to $z_B^{(k)}$. Thereafter, element 131 increments k by one and, if k is not greater than N, then according to decision element 132, control returns to decision element 113. Otherwise, element 133 sets k equal to one and control returns to element 102 to start decoding another block.

The result of the FIG. 12 process is a selection of a symbol which satisfies the criteria imposed by encoder 31 and which unprobably is the symbol that was sent. More specifically, it is a symbol that is part of a valid codeword and it has the correct least significant bit. What remains to be determined is whether the other bits are also the correct bits, and in particular, whether the next-to-least-significant bit is correct.

Figure 13:
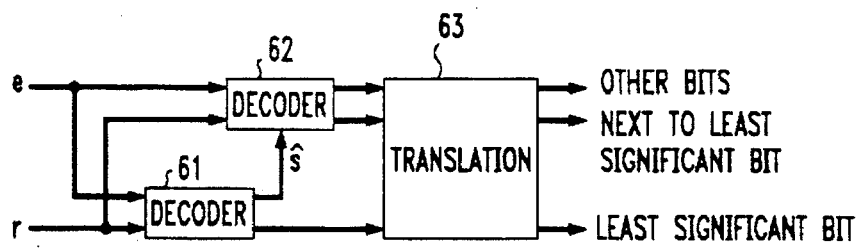
FIG. 13 is a block diagram of a decoder that combines the decoding associated with encoders 31 and 32 and develops an estimate of the sent signal.

The determination of the correct symbol follows the FIG. 13 structure. In FIG. 13, decoder 61 corresponds to the flow chart of FIG. 12 and it determines the least significant bit of the symbol while it determines a tentative symbol, $\hat{s}$. That symbol is applied to decoder 62 which identifies a valid level that comports with the requirements of encoder 32 and, by doing so, identifies the next-to-least-significant bit of the final symbol, s', as well as the remaining bits. Since the next-to-least-significant bit of the symbol was derived through simple parity check encoding, the process of correcting that bit is somewhat simpler than the process shown in FIG. 12. That process is presented in FIG. 14. The output of decoders 61 and 62 corresponds to the least significant bits that were applied to the error correction encoding of elements 31 and 32, and to the bits at the output of mapper 33. To recover the bits at the input of mapper 33, a simple table look-up translation may be employed, and that is accomplished via translator 63.

Figure 14:
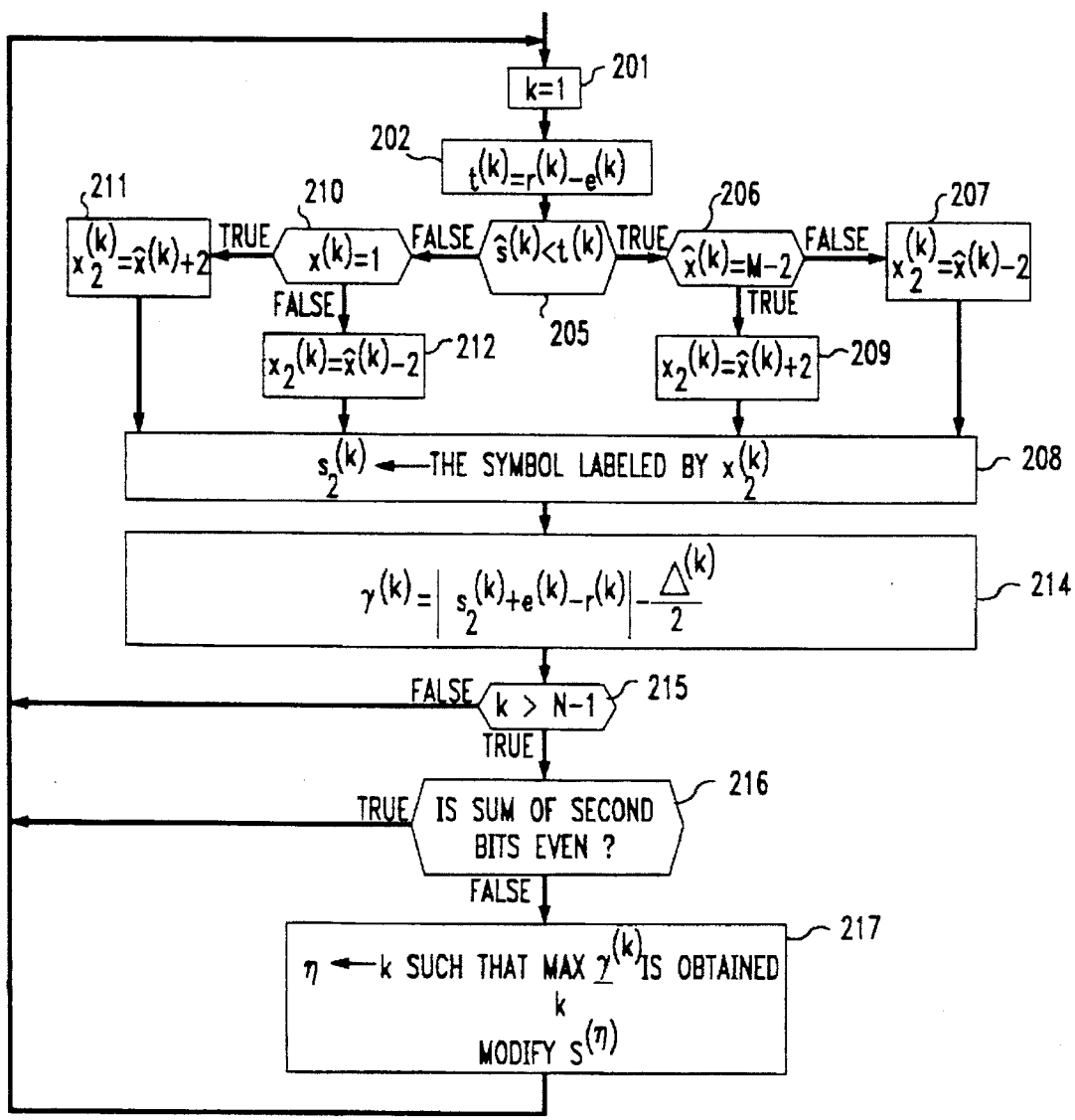
FIG. 14 presents a flow chart of the decoding performed in block 62 of FIG. 13.

Addressing the decoding process of FIG. 14, element 201 sets index k to 1, and element 202 determines the level $t^{(k)}$, which is $r^{(k)} - e^{(k)}$. When $t^{(k)}$ is greater than $\hat{s}^{(k)}$ (the selection made by decoder 61), elements 206, 207 and 209 look at $\hat{x}^{(k)}$, which is the label associated with $\hat{s}^{(k)}$, and select a neighboring label, $x_2^{(k)}$. Control then passes to element 208. Similarly, when $t^{(k)}$ is not greater than $\hat{s}^{(k)}$, elements 210, 211 and 213 also select label, $x_2^{(k)}$ and pass control to element 208. Element 208 associates symbol $s_2^{(k)}$ with level $x_2^{(k)}$. Element 214 evaluates a "cost/benefit" metric for the selection of that second symbol, and it corresponds to $$\gamma^{(k)} = |s_2^{(k)} + e^{(k)} - r^{(k)}| - \frac{\Delta^{(k)}}{2},$$

where $\Delta$ is the distance between the thresholds that surround $r^{(k)}$. Thereafter, element 215 determines whether k is less than N−1, where N is the length of the block (the length of blocks in encoding the least significant bit and the next-to-least significant bit do not need to be the same), and in such a circumstance, control returns to element 201 to determine the metric associated with another member of the block. Otherwise, control passes to element 216 where a determination is made regarding the parity of the signal; i.e., the parity of the second bit in the label of the symbol. When it is determined that parity is even (which is the parity imposed by encoder 32), it is concluded that the initial estimation made by decoder 61 is valid, and the final estimate, $s'^{(k)}$, for all values of k is set equal to the entered estimates $\hat{s}^{(k)}$. Control then passes to element 201 to start a new record. Otherwise, element 217 selects an index η that corresponds to the maximum γ, and modifies that label by setting $s'^{(\eta)}$ to $s_2^{(\eta)}$ (leaving the remaining $s'^{(k)}$ set to $\hat{s}^{(k)}$. Lastly, control again returns to element 201 to begin processing a new record.

The above discloses a number of principles, and some examples embodying the disclosed principles but, of course, various enhancements are possible that are within the spirit and scope of the disclosed invention. For example, while the above speaks of echo as the source of error that is compensated for, it should be apparent that other sources of error that can be estimated within element 200 can also be handled. Also, while the mapper is designed to meet a particular criterion, such as average power, an artisan may choose the lower significance bits of symbols to be unencoded. Further, among the other criteria that may be imposed on the mapper one might wish to select an alphabet of symbols that minimizes the number of symbols that require redundancy for error protection.

We claim:

1. An encoder responsive to an applied digital signal for developing digitized symbols, comprising:

a mapper which, in response to every B bits of said applied signal develops L sets of high significance bits, where each set of the high significance bits contains C bits; and encoding means responsive to bits of said applied signal for developing sets of low significance bits, where each set of the low significance bits contains A bits, where A, B, L, and C are integers and B/L is a mixed fraction, where the low significance bit sets comport with a preselected error correcting schema, and where a concatenation of a most significant bit set of C bits with a low significance bit set of A bits forms one of said symbols, with the C bits forming the more significant bits of the symbol and the A bits forming the less significant bits of the symbol.

2. The encoder of claim 1 wherein said error correcting schema is a block code.

3. The encoder of claim 1 wherein said error correcting schema is a convolutional code.

4. The encoder of claim 1 where the coding means comprises:

first coding stage responsive to bits of said applied signal for developing the least significant bits of said symbols; and second coding stage responsive to bits of said applied signal for developing the next to least significant bits of said symbols.

5. The encoder of claim 1 where the coding means comprises:

first coding stage responsive to bits of said applied signal for developing the least significant bits of said symbols, where said least significant bits of said symbols comport with a first preselected error correcting code; and second coding stage responsive to bits of said applied signal for developing the next to least significant bit of said symbols, where said next to least significant bits of said symbols comport with a second preselected error correcting code.

6. The encoder of claim 5 where said first preselected error correcting code is different from said second preselected error correcting code.

7. The encoder of claim 5 where said first preselected error correcting code is more capable at correcting errors than said second preselected error correcting code.

8. The encoder of claim 1 where the coding means comprises:

first coding stage responsive to bits of said applied signal for developing groups of bits comprising the least significant bits of said symbols, where said least significant bits of said symbols comport with a first preselected error correcting code; and second coding stage responsive to bits of said applied signal for developing middle groups of bits comprising the bits of said symbols that are between said least significant bits of said symbols and said most significant bits of said symbols, where said middle groups of bits of said symbols comport with a second preselected error correcting code.

9. The encoder of claim 1 where the coding means comprises:

first coding stage responsive to bits of said applied signal for developing groups D of bits, where said groups D comport with a first preselected error correcting code; and second coding stage responsive to bits of said applied signal for developing groups E of bits, where said groups E comport with a second preselected error correcting code;

where each of said symbols is a concatenation of the C bits of a set of high significance bits from the mapper and the bits from groups E, and D, in order, where the C bits from the mapper comprise the most significant bits of each symbol.

10. The encoder of claim 1 where the coding means comprises:

first coding means responsive to bits of said applied signal for developing groups D of bits, where said groups D comport with a first preselected error correcting code;

second coding means responsive to bits of said applied signal for developing groups E of bits, where said groups E comport with a second preselected error correcting code;

means for developing groups F from preselected uncoded and unmapped bits of said applied signal; and means for forming symbols from said groups D, E, and F, and the C bits from the mapper, where each of said symbols is a concatenation of the C bits of a set of high significance bits from the mapper and the bits from groups F, E, and D, in order, where the C bits of the mapper comprise the most significant bits of each symbol.

11. The encoder of claim 1 where bits employed by the mapper and bits employed by the encoding means are mutually exclusive.

12. The encoder of claim 1 where said coding means performs multi-level coding.

13. The encoder of claim 1 where said coding means performs multi-level coding to create sets A of bits, each set A comprises two subsets, and one of the subsets comports with a first preselected error correction code, and the other of the subsets is unencoded.

14. The encoder of claim 1 where said coding means performs multi-level coding to create sets A of bits, each set A comprises two subsets, and one of the subsets comports with a first preselected error correction code, and the other of the subsets comports with a second preselected error correction code.

15. The encoder of claim 14 where said first preselected error correction code is a block code, and said second preselected error correction code is a parity code.

16. The encoder of claim 14 where said first preselected error correction code is a convolution code, and said second preselected error correction code is a parity code.

17. The encoder of claim 14 where said first preselected error correction code is a convolution code, and said second preselected error correction code is a block code.

18. The encoder of claim 11 where said coding means performs multi-level coding to create sets A of bits, each set A comprises three subsets, and one of the subsets comports with a first preselected error correction code, another of the subsets comports with a second preselected error correction code, and a third of the subsets is uncoded.

19. The encoder of claim 1 where the mapper contains an alphabet of symbols that minimize the average power of signals developed from said symbols.

20. The encoder of claim 1 where the mapper contains an alphabet of symbols that maximizes the number of symbols that correspond to signals having a large power requirement, within a given constraint of maximum average power.

21. The encoder of claim 1 where the mapper contains an alphabet of symbols that minimizes the number of symbols that require redundancy for error protection.

22. An encoder responsive to an applied digital signal for developing digitized symbols, comprising:

a mapper which, in response to every B bits of said applied signal develops L sets of high significance bits, where each set of the high significance bits contains C bits; and encoding means responsive to bits of said applied signal for developing sets of low significance bits, where each set of the low significance bits contains A bits, where A, B, L, and C are integers and B/L is a mixed fraction, where the mapper contains an alphabet of symbols that minimize the average power of signals developed from said symbols, where the low significance bit sets are unencoded, and where a concatenation of a most significant bit set of C bits with a low significance bit set of A bits forms one of said symbols, with the C bits forming the more significant bits of the symbol and the A bits forming the less significant bits of the symbol.

* * * * *

UNITED STATES PATENT AND TRADEMARK OFFICE
CERTIFICATE OF CORRECTION

PATENT NO. : 5,659,579
DATED : August 19, 1997
INVENTOR(S) : Hanan Herzberg

It is certified that error appears in the above-identified patent and that said Letters Patent is hereby corrected as shown below:

Column 7, line 50, "cirterion" should read --criterion--.
Column 12, line 49, "coding means" should read --encoding means--.
             line 58, "coding means" should read --encoding means--.
Column 13, line 7, "coding means" should read --encoding means--.
             line 22, "coding means" should read --encoding means--.
             line 37, "coding means" should read --encoding means--.
             line 60, "coding means" should read --encoding means--.
             line 64, "coding means" should read --encoding means--.
             line 65, "sets A of bits" should read --sets of A bits--.
Column 14, line 1, "each set A" should read --each set--.
             line 7, "coding means" should read --encoding means--.
             line 8, "sets A of bits" should read --sets of A bits--.
             line 9, "each set A" should read --each set--.
             line 24,"coding means" should read --encoding means--.
             line 25, "sets A of bits" should read --sets of A bits--.
             line 26, "each set A" should read --each set--.

Signed and Sealed this

First Day of June, 1999

Attest:

Q. TODD DICKINSON

*Attesting Officer*      *Acting Commissioner of Patents and Trademarks*